US008214786B2

(12) United States Patent
Kuekes et al.

(10) Patent No.: US 8,214,786 B2
(45) Date of Patent: Jul. 3, 2012

(54) SCALABLE, COMPONENT-ACCESSIBLE, AND HIGHLY INTERCONNECTED THREE-DIMENSIONAL COMPONENT ARRANGEMENT WITHIN A SYSTEM

(75) Inventors: Philip J. Kuekes, Menlo Park, CA (US); R. Stanley Williams, Redwood City, CA (US); Raymond G. Beausoleil, Jr., Redmond, WA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1809 days.

(21) Appl. No.: 10/935,845

(22) Filed: Sep. 8, 2004

(65) Prior Publication Data
US 2006/0053397 A1   Mar. 9, 2006

(51) Int. Cl.
*G06F 17/50* (2006.01)
(52) U.S. Cl. ........................................... 716/119
(58) Field of Classification Search ............ 716/15, 716/8–11, 119
See application file for complete search history.

(56) References Cited

U.S. PATENT DOCUMENTS

| | | | |
|---|---|---|---|
| 3,812,402 A | 5/1974 | Garth | |
| 5,497,471 A | 3/1996 | Gillett et al. | |
| 5,729,752 A | 3/1998 | Snider et al. | |
| 6,268,238 B1* | 7/2001 | Davidson et al. | 438/107 |
| 6,469,901 B1* | 10/2002 | Costner | 361/730 |
| 2002/0048955 A1* | 4/2002 | Vasquez | 438/689 |
| 2002/0160598 A1* | 10/2002 | Kong | 438/613 |
| 2004/0160742 A1* | 8/2004 | Weiss | 361/712 |
| 2005/0023656 A1* | 2/2005 | Leedy | 257/678 |

FOREIGN PATENT DOCUMENTS

| | | |
|---|---|---|
| DE | 4119 038 | 12/1992 |
| JP | 6-090072 | 3/1994 |
| JP | 7-221420 | 8/1995 |
| JP | 9-172240 | 6/1997 |
| JP | 2007-531222 | 11/2007 |
| WO | WO 93/03432 | 2/1993 |

OTHER PUBLICATIONS

Heath, James R. et al., "A Defect-Tolerant Computer Architecture: Opportunities for Nanotechnology," Science, vol. 280, Jun. 12, 1998.
Decision of Refusal, JP Application No. 2007-531222, Japanese Patent Office, drafted Nov. 30, 2009, English Translation.

* cited by examiner

*Primary Examiner* — Suresh Memula (57) ABSTRACT

Embodiments of the present invention include dense, but accessible and well-interconnected component arrangements within multi-component systems, such as high-end multi-processor computer systems, and methods for constructing such arrangements. In a described embodiment, integrated-circuit-containing processing components, referred to as a "flat components," are arranged into local blocks of intercommunicating flat components. The local flat-component blocks are arranged into interconnected, primitive multi-local-block repeating units, and the primitive local-block repeating units are layered together in a three-dimensional, regularly repeating structure that can be assembled to approximately fill any specified three-dimensional volume. The arrangement provides for relatively short, direct pathways from the surface of the specified volume to any particular local block and flat component within the three-dimensional arrangement.

11 Claims, 13 Drawing Sheets

SCALABLE, COMPONENT-ACCESSIBLE, AND HIGHLY INTERCONNECTED THREE-DIMENSIONAL COMPONENT ARRANGEMENT WITHIN A SYSTEM

TECHNICAL FIELD OF THE INVENTION

The present invention relates to computer architecture and, in particular, to a method and organizational structure for relatively tightly packing and interconnecting components, including integrated circuits or other types of electrical components, optical components, or fluidic components, within a compact, three-dimensional volume to which additional components can be easily added, and within which individual components remain accessible from points external to the three-dimensional volume.

BACKGROUND OF THE INVENTION

During the past fifty years, electronic computing systems have evolved from elaborate, room-sized, vacuum-tube-based behemoths to fantastically fast and efficient, by comparison, integrated-circuit-based computer systems, including extremely powerful, multiple-vector-processor and massively parallel supercomputer systems. In high-end supercomputer systems, great attention is spent to design efficient interprocessor communications and to organize processors spatially within the supercomputer systems in order to provide short, reasonably direct, high bandwidth interconnections between the processors to allow for distribution of computing tasks among multiple processors.

The extremely high switching speeds of current submicroscale and nanoscale electronic circuits are sufficiently fast that an electronic signal representing a first logical state may only travel a few tenths of centimeters, at the speed of light, along a signal path before a signal from a next state is generated by a processor. Because communications paths are limited in the number of logical states that can be communicated within the signal path at a given instant in time, the physical separation of processors interconnected by metallic wires or optical light paths may therefore introduce significant processing delays in multiple-processor systems. Improved methods and techniques for parallel processing, including improved compiler technology and improved algorithmic methods for decomposing large tasks into separate, parallel tasks, have allowed for potentially efficient use of greater numbers of processors in massively parallel computer systems. Such configurations have resulted in ever decreasing miniaturization of integrated circuits with corresponding increasing densities, both within integrated-circuit devices, as well as in multi-integrated-circuit-component devices, such as multi-processor devices. However, both in single integrated-circuit systems, as well as in multi-component systems, the trend towards increasing component densities is balanced by the need to provide high bandwidth interconnections between components, to provide direct access to components, and to provide pathways by which heat can be dissipated. Thus, designers and manufacturers of high-end, multi-component computer systems and other electronic systems continue to seek methods for organizing electronic components, such as integrated circuits, within multi-component devices to provide both high-component-density arrangements as well as accessibility and interconnectivity.

SUMMARY OF THE INVENTION

Embodiments of the present invention include dense, but accessible and well-interconnected component arrangements within multi-component systems, such as high-end multi-processor computer systems, and methods for constructing such arrangements. In one described embodiment, integrated-circuit-containing processing components, referred to as "flat components," are arranged into local blocks of intercommunicating flat components. The local flat-component blocks are arranged into interconnected, primitive multi-local-block repeating units, and the primitive local-block repeating units are layered together in a three-dimensional, regularly repeating structure that can be assembled to approximately fill any specified three-dimensional volume. The arrangement provides for relatively short, direct pathways from the surface of the specified volume to any particular local block and flat component within the three-dimensional arrangement.

DETAILED DESCRIPTION OF THE INVENTION

One embodiment of the present invention is directed to a method for arranging planar components, such as integrated circuits, of a high-end computing system, or other electronic system, in a specified volume in order to achieve (1) highly interconnected components; (2) direct communication paths from points external to the specified volume to each individual component; (3) scalability in volume and dimensions; (4) flexibility in inter-component spacings; and (5) inclusion of modular subassemblies and additional components. Although a number of related embodiments are described below, there are a profoundly large number of possible variations in both the design of the individual components as well as in interconnection methodologies and spatial arrangements. The present invention, as defined by the claims that follow, encompasses a very large number of alternate embodiments that, for practical reasons related to length of description and clarity of description, are not all disclosed, in detail, below.

Figure 1:
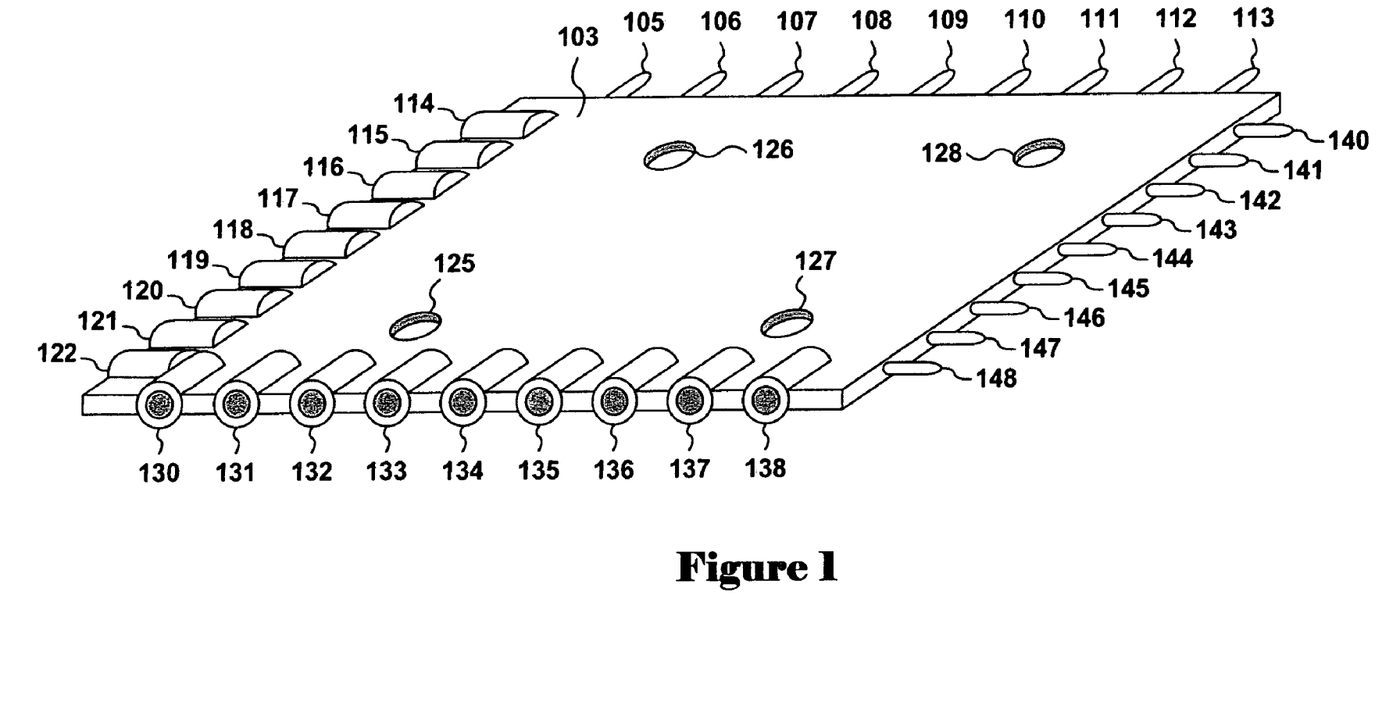
FIG. 1 shows an individual, planar component of a high-end computing system, or other electrical system, that is arranged by certain methods of the present invention, into a dense, interconnected, three-dimensional arrangement.

FIG. 1 shows an individual, planar component of a high-end computing system, or other electrical system, that is arranged by methods of the present invention, into a dense, interconnected three-dimensional arrangement. The component 101 comprises a square, planar substrate 103 with a series of connectors, such as connectors 105 and 114, to allow for interconnecting the component with neighboring components in a three-dimensional arrangement. This planar component is referred to as a "flat component". The flat component shown in FIG. 1 is selected for description of embodiments of the present invention in order to demonstrate the applicability of embodiments of the invention to components with relatively low symmetry. Higher symmetry components, including square, flat components having a single type of bi-directional connector and having four-fold rotational symmetry, represent a much simpler case with regard to multi-component assembly. The term "flat" is meant to indicate only the fact that the components are thinner in one dimension than in the other two dimensions. Surfaces of the flat components are not necessarily smooth or planar, but may include raised and sunken features, and other types of surface features, patterns, or textures. The exemplary flat 101 component shown FIG. 1 also includes four apertures 125-128 to allow multiple flat components to be assembled along cylindrical posts, or columns that pass through the apertures. Again, these apertures represent only one of many different possible interconnection strategies. In alternative embodiments, connection may be accomplished with spacer components, without need for apertures.

The flat component shown in FIG. 1 includes connectors, such as connectors 105 and 114, along each of the four edges perpendicular to the planar surface. In the exemplary flat component 101 shown in FIG. 1, the arrangement of connectors is less symmetrical than the square flat component substrate, which has a central four-fold rotation axis coincident with two orthogonal mirror planes, all perpendicular to a mirror plane coincident with the center of the plane of the flat component. Connector 105 is a male connector that can be inserted into a female connector, such as female connector 114. The flat component with connectors therefore has only a diagonal, vertical mirror plane orthogonal to a horizontal mirror plane, with a first pair of a set of male connectors 105-113 and female connectors 114-122 related to a second pair of male connectors 140-148 and female connectors 130-138 by the diagonal, vertical mirror plane. For the purposes of the present invention, the actual internal structure of the flat component, including electronic circuitry, optical circuitry, fluid circuitry, or other electronic, optical, fluidic, mechanical, of hybrid components, substrate materials, method for manufacture, and other parameters, is not considered. The internal electronics may result in the flat component having even less symmetry, and may result in restrictions on orientations of flat components and larger structures within the three-dimensional tiling method, to be described below.

The present invention relates to the arrangement of the flat components in space, rather than to the internal composition or method of manufacture of the flat components. In particular, although only one arrangement of female/male connectors is described, for the sake of illustrative simplicity, with reference to FIG. 1, many different types of flat component-to-flat component connection mechanisms and methods may be employed, including inter-flat-component connections described in U.S. Pat. No. 5,729,752. Moreover, for the sake of illustrative simplicity, the connectors of the exemplary flat component are shown to be radially symmetric and positioned along the center of the edges of the flat component. However, less symmetric or more symmetric placements of connectors, in which the connectors are fastened to either or both of the planar sides of the flat component, may alternatively be employed. Each connector pair, such as connector 105 and a corresponding female connector on a neighboring flat component, may include any number of individual signal paths, including electrical, optical, fluid, or other signal paths that together connect a flat component to its neighboring flat component. Although the exemplary flat component includes the four apertures 125-128, alternative embodiments are described, below, for assembling individual flat components into a local block of flat components. Alternative embodiments may employ different types of connector-arrangement symmetries, in turn providing different types of overall flat component symmetries and three-dimensional tilings, or lattices.

Figure 2:
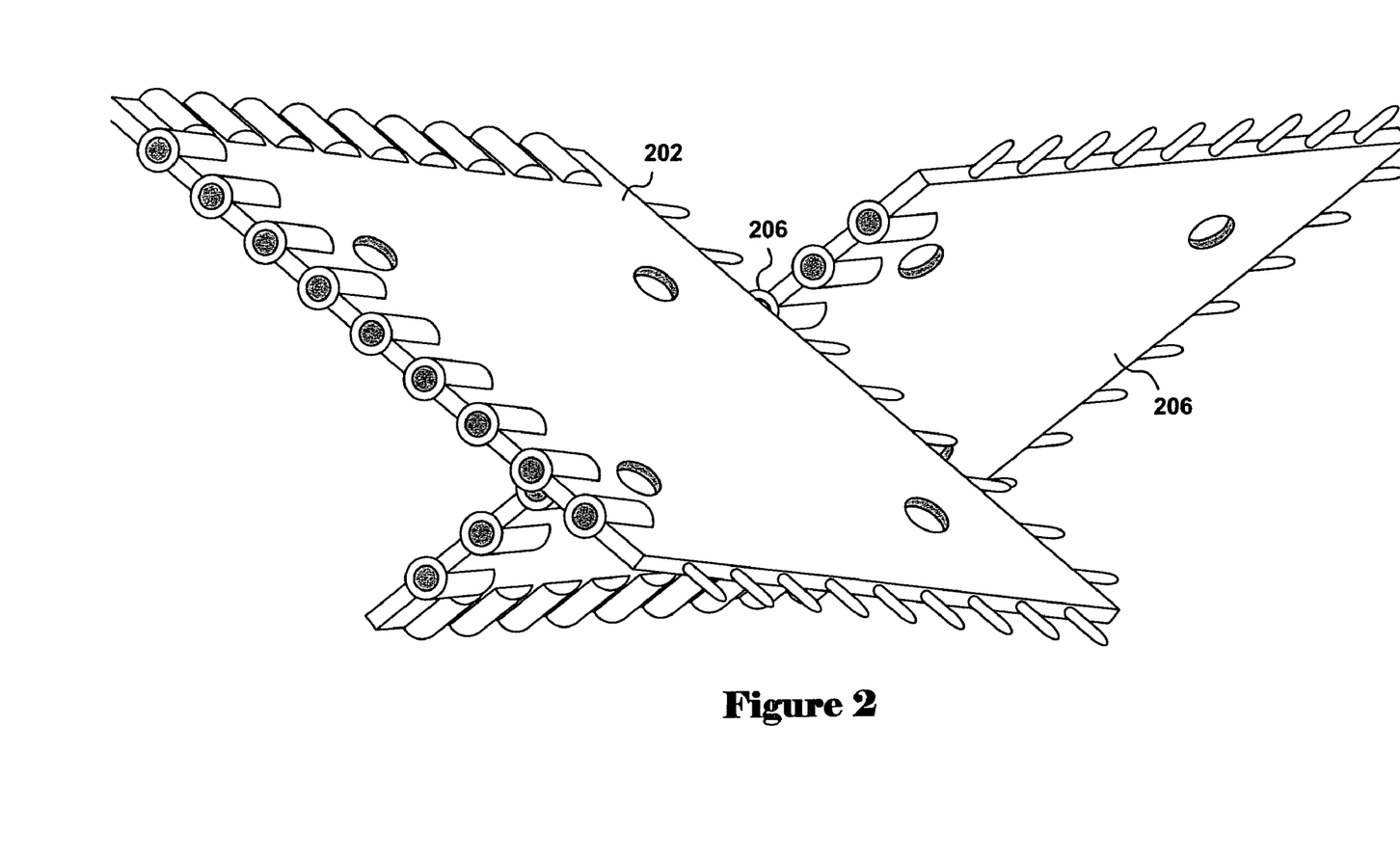
FIG. 2 shows the interconnection of two neighboring flat components employed in certain methods of the present invention.

FIG. 2 shows the interconnection of two neighboring flat components employed in certain methods of the present invention. As shown in FIG. 2, a first flat component 202 is interconnected with a second flat component 204 via a male connector of the first flat component (obscured) and a corresponding female connector 206 of the second flat component 204. Neighboring flat components are connected together so that they are perpendicularly disposed to one another. In this way, the first flat component 202 may be interconnected along a single edge with a set of parallel, neighboring flat components all perpendicular to the first flat component, the number of parallel, neighboring flat components equal to or less than the number of connectors along the edge of the first flat component. For flat components with edges at the surface of a three-dimensional volume, the unused connectors may be terminated by external connector terminators, may be interconnected with one another by external surface interconnectors, may be internally terminated, or may be left open, depending on the nature of the internal electronics within the flat components and the nature of the computer system or other high-end electrical system containing the three-dimensional network of flat components.

Figure 3:
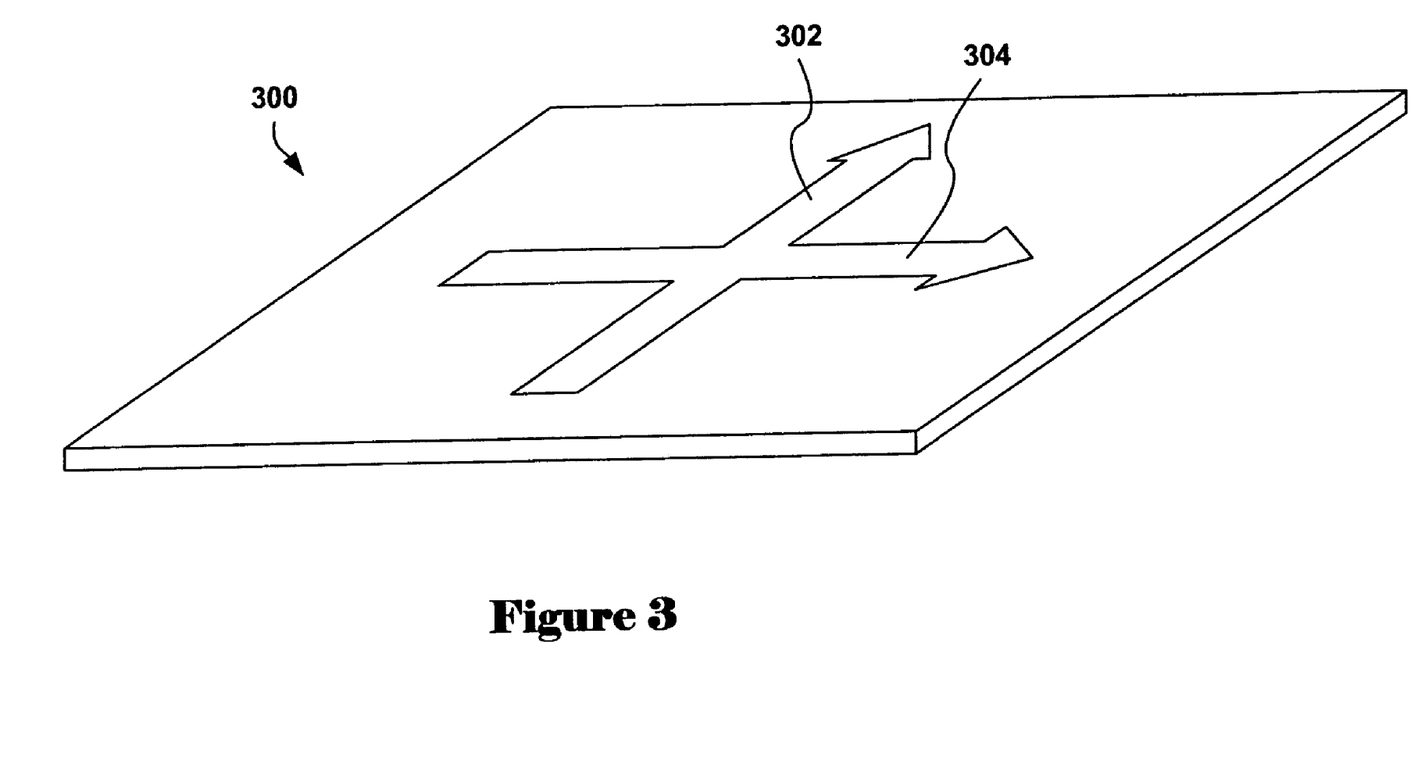
FIG. 3 shows an illustration convention used to represent the exemplary flat component shown in FIG. 1.

To facilitate description of the three-dimensional arrangement of flat components that represents on embodiment of the present invention, each flat component is subsequently illustrated using a simplified illustration convention. FIG. 3 shows the illustration convention used to represent the exemplary flat component shown in FIG. 1. In FIG. 3, the directions in which the male connectors protrude from the edges of the exemplary flat component are indicated by two, partially overlying, mutually perpendicular arrows 302 and 304. The simplified illustration convention 300 for the exemplary flat component (101 in FIG. 1) allows for easy representation of sets of flat components within a three-dimensional representation. Again, for illustration convenience, the flat components are considered to be bilaterally symmetric with respect to a symmetry plane coplanar with the planar flat component, and passing through the center of the planar flat component. However, in alternative embodiments, flat components may be not be symmetric with respect to the mirror plane, and may therefore be more constrained in the positions that they occupy in different three-dimensional arrangements than the described flat components. As also discussed above, flat components may have higher symmetry, in which case the twoarrow representation shown in FIG. 3 can be replaces with a simple, square-planar representation without arrows.

Figure 4:
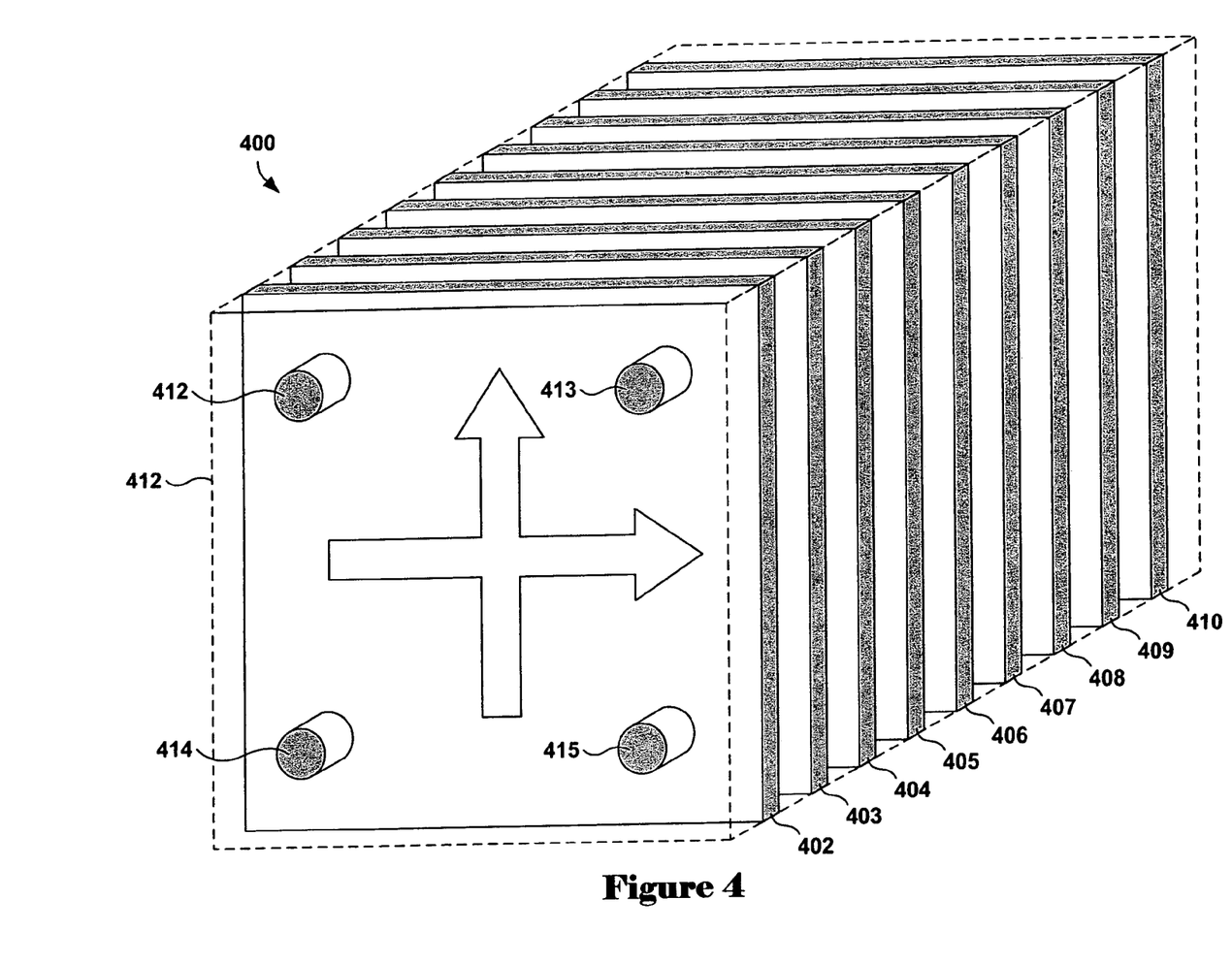
FIGS. 4 and 5 illustrate construction of local flat-component blocks from individual flat components employed in certain methods of the present invention.
Figure 5:
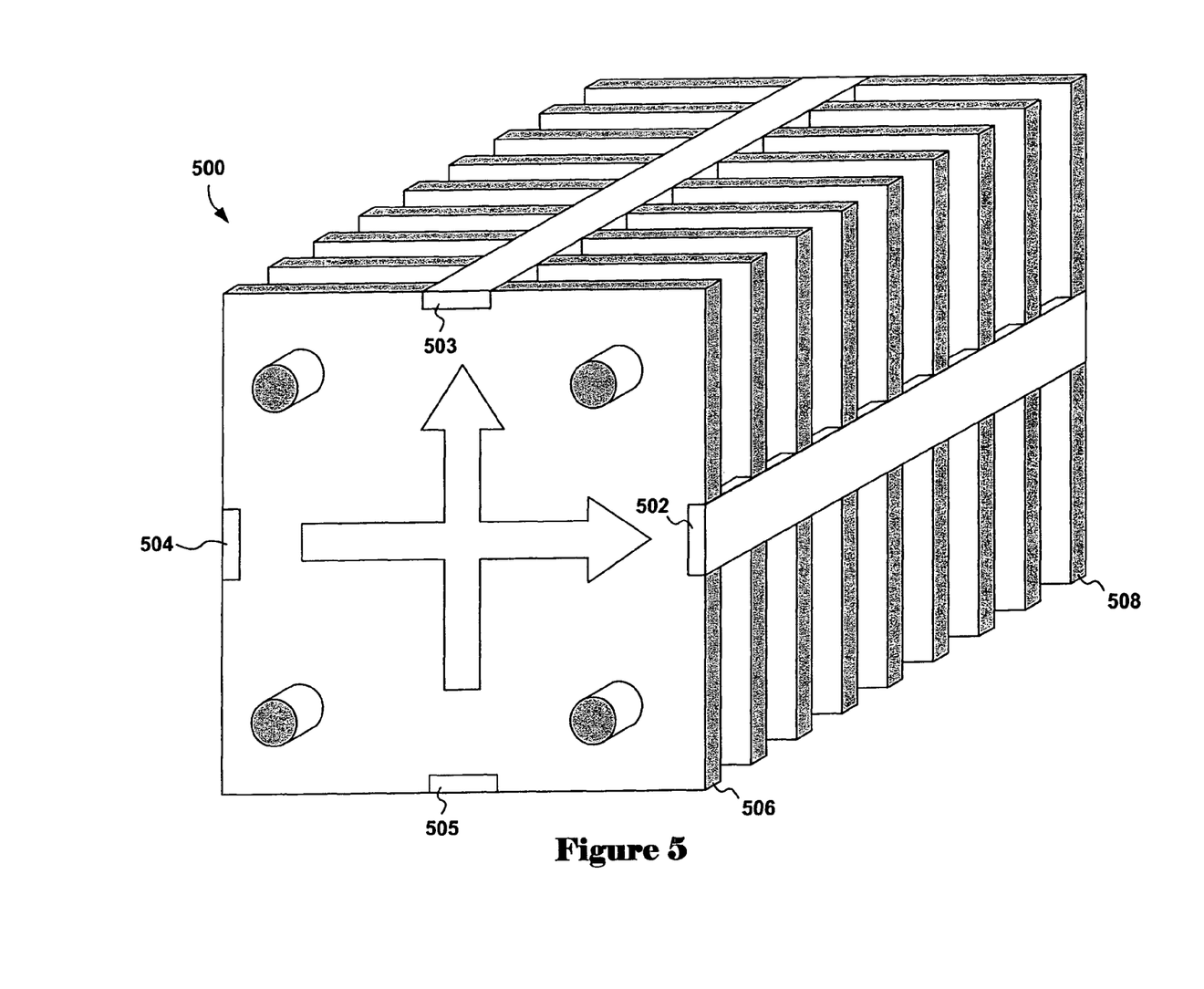

FIGS. 4 and 5 illustrate construction of local flat-component blocks, or local component blocks, from individual flat components, employed in certain methods of the present invention. FIGS. 4 and 5 illustrate two alternative local-flat-component-block constructions, although many additional alternatives are possible. In FIG. 4, nine flat components 402-410 are held together in parallel fashion with constant spacing between one another by four cylindrical posts or columns 412-415. The parallel flat components 402-410 are spaced so that a single neighboring flat component, perpendicular to the parallel flat components 402-410, may be interconnected, using the connectors of one edge of the single neighboring flat component, to each of the parallel flat components 402-410 and the local-flat-component block 400. Note that the local-flat-component block is considered to be a cube with the dimension, normal to the plane of the included parallel flat components, including the length of the cylindrical columns or posts 412-415 extending out from the surfaces of the first flat component 402 and the final flat component 410, as indicated by the dashed lines, such as dash line 418, in FIG. 4. Comparison of the exemplary flat component shown in FIG. 1 with the exemplary local-flat-component block 400 in FIG. 4 reveals that a flat component placed perpendicularly to the parallel flat components in the exemplary local-flat-component block has connectors corresponding to each flat component edge of the local flat-component block. A local flat-component block may include as many flat components as the maximum number of connectors that can be fabricated on a flat component edge.

In an alternative embodiment, shown in FIG. 5, a local flat-component block 500 is held together by four rectangular posts or columns 502-505 positioned within corresponding slots at the center of each edge of each flat component. In the local flat-component block shown in FIG. 5, the outer surface of the first flat component 506 and the final flat component 508 are coincident with the two surfaces of the local flat-component block normal to the rectangular posts or columns 502-505. As noted above, many alternative methods for constructing a local flat-component block may be employed. Rather than central rectangular posts or columns, for example, L-shaped corner posts or columns may be employed. In alternative embodiments, small spacers between the parallel flat components may be used in order to separate the flat components by a constant distance corresponding to the separation of connectors along the edges of flat components. In many implementations, the flat components may be extremely thin, so that the majority of the volume of a local flat-component block is empty space. In other implementations, either thicker flat components may be used, or the flat components may be more closely spaced, to decrease the amount of empty space within a local flat-component block. The separation distance of parallel flat components within a local flat-component block may be dictated by the size needed for communication pathways within a three-dimensional arrangement of flat components, by the empty space needed for heat dissipation, by the size of connectors needed for interconnecting neighboring flat components and the flat component dimensions, and by many other considerations.

The flat components within a local flat-component block are interconnected via connecting wires, channels, or light paths that pass through the columns, posts, spacers, or other structural members that hold the flat components together. Each flat component may be directly connected with all other flat components in the local flat-component block, or may alternatively be directly interconnected with only one or both adjacent, neighboring flat components, or with subgroups of flat components.

Figure 6:
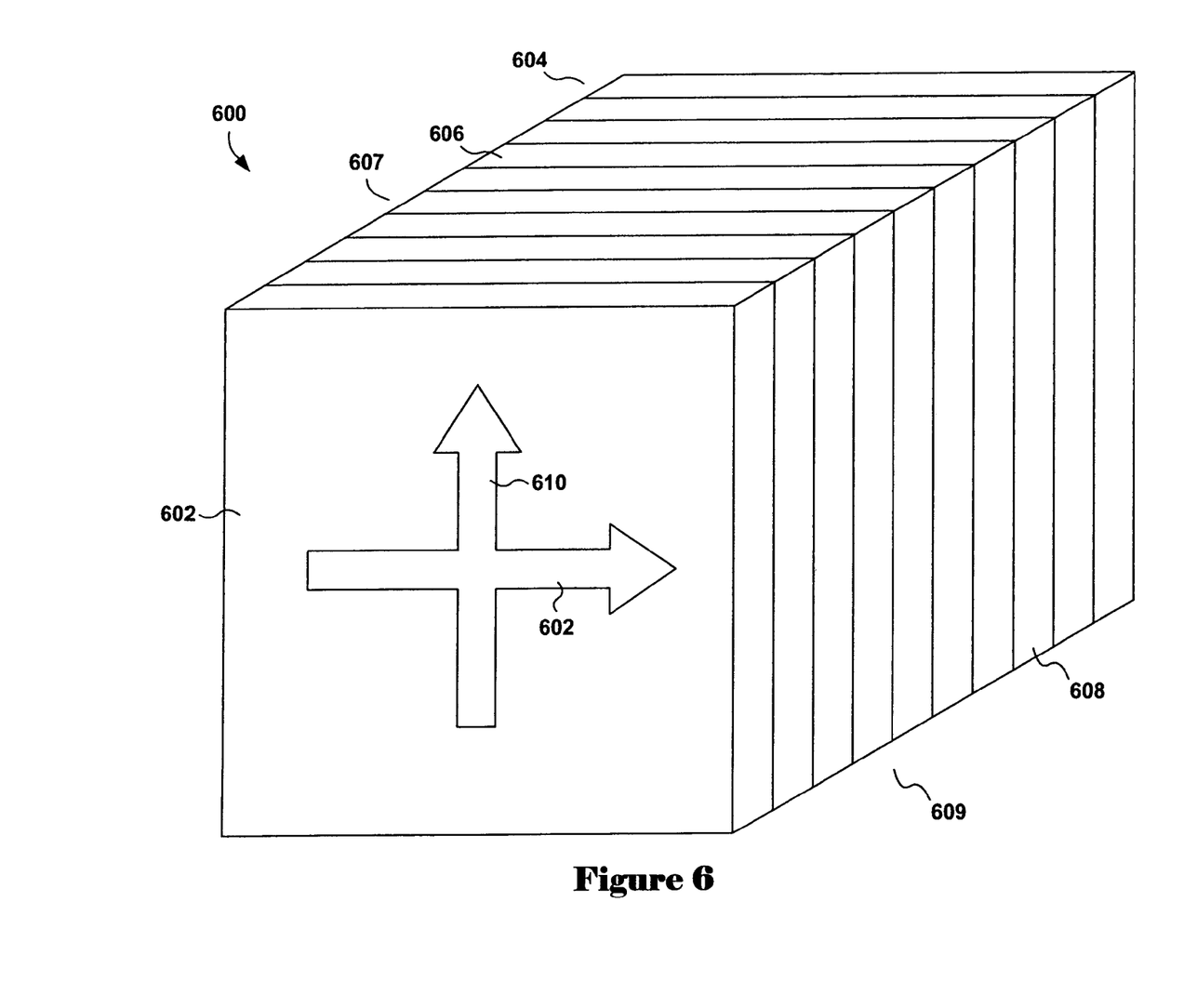
FIG. 6 shows an illustration convention used to illustrate either of the exemplary local flat-component blocks shown in FIGS. 4 and 5.

To facilitate description of the three-dimensional spatial arrangement of flat components that represents one embodiment of the present invention, a local flat-component block is represented using a simplified illustration convention. FIG. 6 shows an illustration convention used to illustrate either of the exemplary local flat-component blocks shown in FIGS. 4 and 5. The local flat-component block has two faces 602 and 604, either coincident with, or parallel and near to, the planar surfaces of the first and last flat components within the local flat-component block. The four faces of the local flat-component block consisting of sets of parallel flat component edges 606-609 are indicated by sets of parallel lines representing the edges of the parallel flat components. The directions of the protrusion of male connectors from the flat components in the local flat-component block are indicated by the partially overlying, mutually perpendicular arrows 610 and 612, as in the illustration convention used for a single flat component, shown in FIG. 3. Note that, in the described embodiment, each flat component in a local area block is similarly oriented so that the faces of the local-area block consisting of flat component edges each includes only one type of connector. In the described embodiment, a local flat-component block has mirror-plane symmetry with respect to an internal, diagonal mirror plane and with respect to a mirror plane passing through the central flat component, when the local flat-component block includes an odd number of parallel flat components, or in-between the two central flat components, when the local flat-component block includes an even number of parallel flat components. Three-dimensional arrangements of flat components different from that described below may arise from different local-flat-component block symmetries that may be, in part, determined by flat component symmetries different from the symmetries of the exemplary flat component and local flat-component blocks shown in FIGS. 1, 4, and 5.

Figure 7:
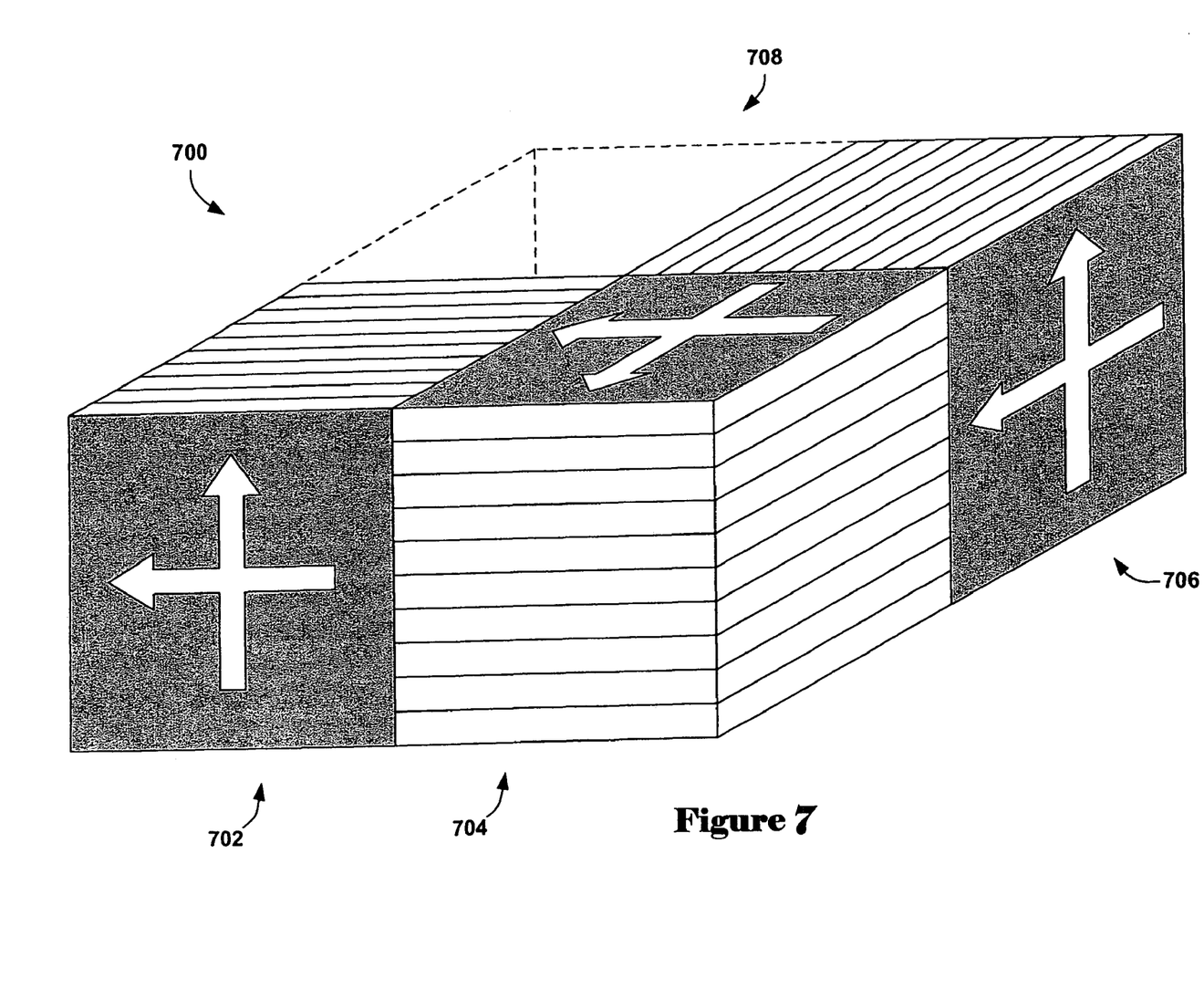
FIG. 7 illustrates a primitive repeating unit ("PRU") constructed from three local flat-component blocks employed in certain methods of the present invention.

FIG. 7 illustrates a primitive repeating unit constructed from three local flat-component blocks employed in certain methods of the present invention. The primitive repeating unit ("PRU") is the smallest, complete subunit within a three-dimensional lattice, representing one embodiment of the present invention that repeats, in a fixed orientation, in all three mutually perpendicular directions within a three-dimensional volume. For the three-dimensional arrangement that represents one embodiment of the present invention, one of four different primitive cells may be selected. Moreover, a mirror-symmetry-related, alternative three-dimensional arrangement of flat components related to the below described three-dimensional arrangement may be constructed from one of four possible PRUs related by mirror symmetry to the four possible PRUs that can be selected from the described three-dimensional flat component arrangement. Additional types of PRUs may lead to different three-dimensional arrangements with characteristics similar to the desirable characteristics of the described three-dimensional arrangement.

The PRU 700 shown in FIG. 7 includes three local flat-component blocks 702, 704 and 706 as well as an empty slot, or empty subspace 708, having the same dimensions as those of a local flat-component block. The three local flat-component blocks within the PRU are mutually perpendicular. Local flat-component blocks 702 and 704 are interconnected along an internal, planar interface such that each flat component in local flat-component block 702 is connected with each flat component in local flat-component block 704. Similarly, each flat component of local flat-component block 704 is connected to each flat component of local flat-component block 706. Therefore, each flat component in the PRU 700 is either directly or indirectly interconnected with every other flat component in the PRU. The flat components of local flat-component block 702 are interconnected with the flat components of local flat-component block 706 indirectly through each of the flat components in local flat-component block 704.

As previously noted, a local flat-component block may consist primarily of empty space, may consist primarily of flat component substrates, or may have any of a continuous range of flat component densities depending on the interspacings and thickness of the flat components, the number of connectors that can be placed on a wafer's edge, and the numbers of flat components included within a flat-component block. Regardless of the internal densities of local flat-component blocks, a PRU has a maximum internal density of 75 percent of the density of a local flat-component block. Note also that all three local flat-component blocks within the PRU are identical, and are orientated in a mutually perpendicular fashion in order to provide maximal interconnection between the flat components of adjoining local flat-component blocks.

Figure 8:
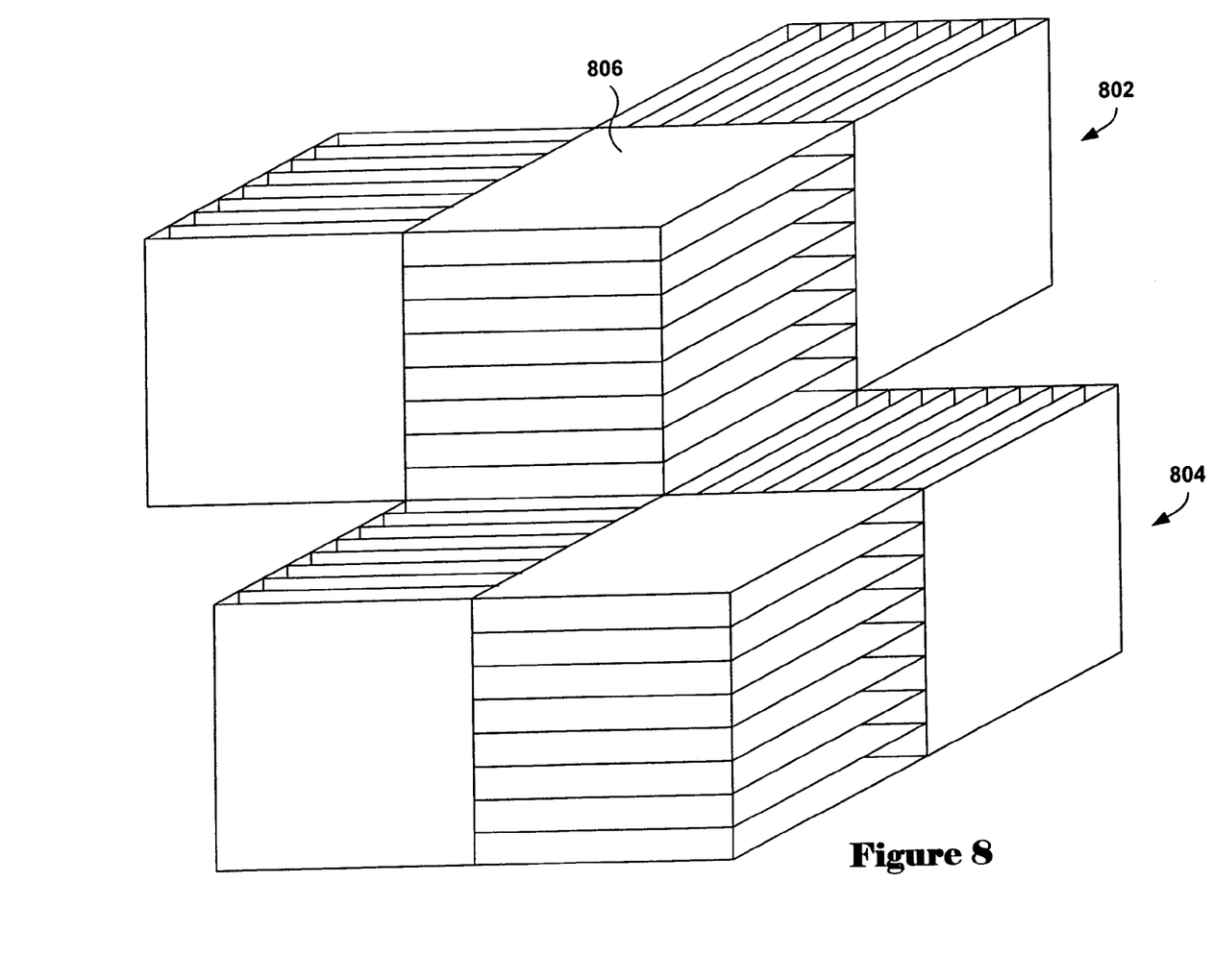
FIG. 8 illustrates a staggered layering of PRUs employed in certain methods of the present invention.

PRUs may be used to tile any specified three-dimensional volume. Of course, for specified three-dimensional volumes with curved surfaces, the tiling can only be approximate, just as a circle may only be approximately tiled using small square tiles. PRUs may be placed side-to-side, all in a single orientation, to tile a two-dimensional surface in a regular, grid-like PRU matrix comprising PRU columns orthogonal to PRU rows. The two-dimensional surfaces may be layered one above the other, in a staggered fashion, in order to produce a three-dimensional arrangement of local flat-component blocks having a number of desirable properties for components of computer systems and other high-end electronics systems. FIG. 8 illustrates the basic staggered layering of PRUs employed in certain methods of the present invention. Each PRU, such as PRU 802, in a first two-dimensional layer immediately above, and adjacent to, a second two-dimensional layer of PRUs is arranged so that the local flat-component block 806 with horizontal flat components, or flat components normal to a perpendicular to the largest surfaces of the PRU, is placed directly above the empty slot, or subspace, of a lower PRU 804. Thus, the PRUs of one two-dimensional layer are diagonally staggered, by half the dimension of a PRU, in both, orthogonal, column and row directions of the two-dimensional layer.

Figure 9:
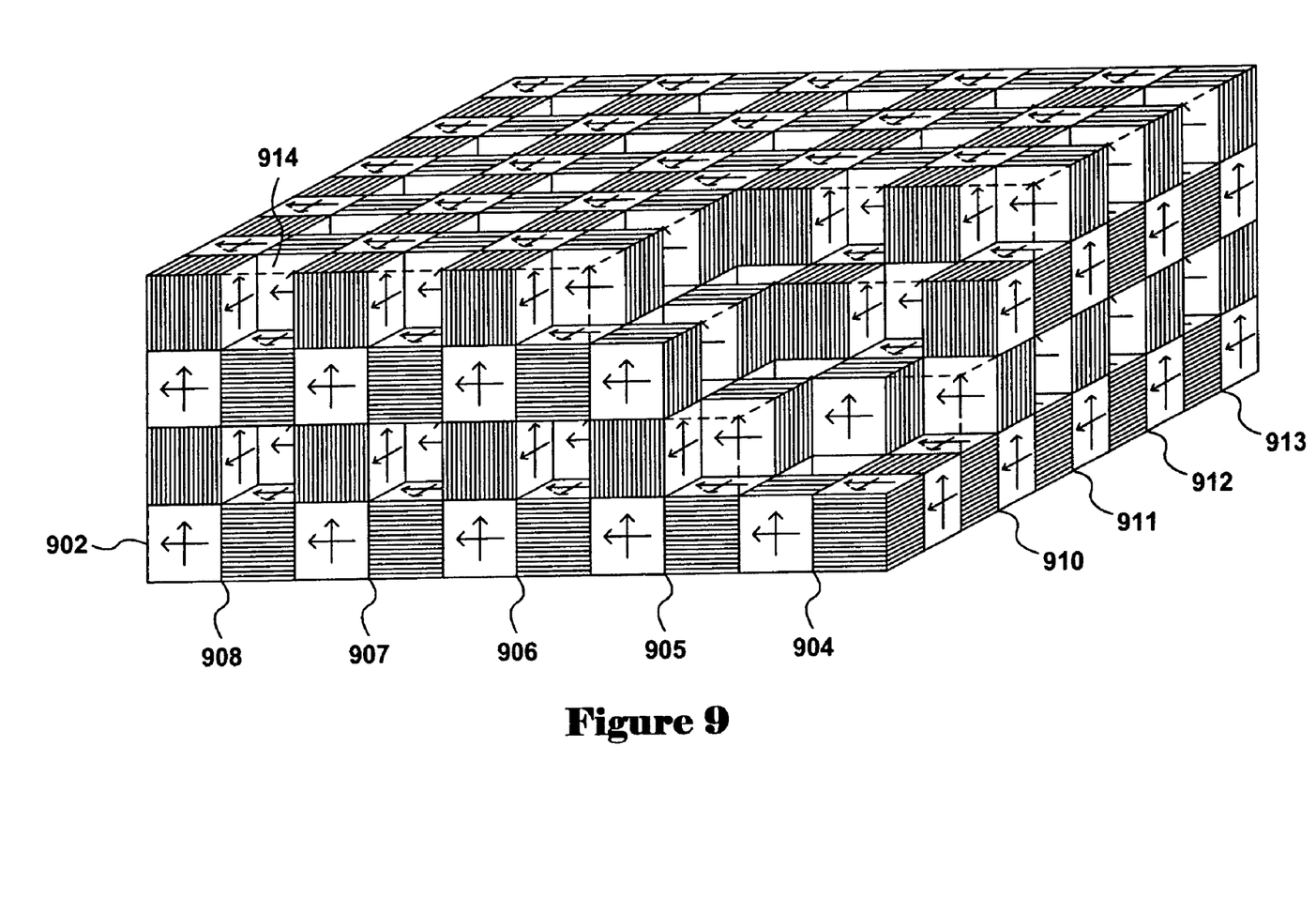
FIG. 9 illustrates a rectangular, three-dimensional volume tiled by PRUs such as the exemplary PRU shown in FIG. 7 employed in certain methods of the present invention.

FIG. 9 illustrates a rectangular, three-dimensional volume tiled by PRUs, such as the exemplary PRU shown in FIG. 7, employed in certain methods of the present invention. In FIG. 9, five PRUs 904-908 form a horizontal row of PRUs along the front facing edge of the first two-dimensional layer 902, and PRUs 904 and 910-913 form a vertical column of PRUs along the right-hand edge of the two-dimensional first layer. The rectangular, three-dimensional arrangement of local flat-component blocks shown in FIG. 9 is displayed in a cutaway fashion, with a number of local flat-component blocks constituting the upper, foreground, right-hand corner of the three-dimensional rectangular volume removed to reveal interior local flat-component blocks. All of the faces of the rectangular, three-dimensional volume include open slots, such as open slot 914, corresponding to the open, or unfilled, slots or subspaces of individual PRUs. As can be seen in the cutaway portion of the rectangular volume, open slots occur at regular intervals within the interior of the rectangular volume as well. These open slots may, in various implementations, be filled with a variety of different sensors, interconnection modules, components, or other types of inclusions needed within the densely packed arrangement of flat components for maintenance, control, sensing, communications, and other functions.

Figure 10:
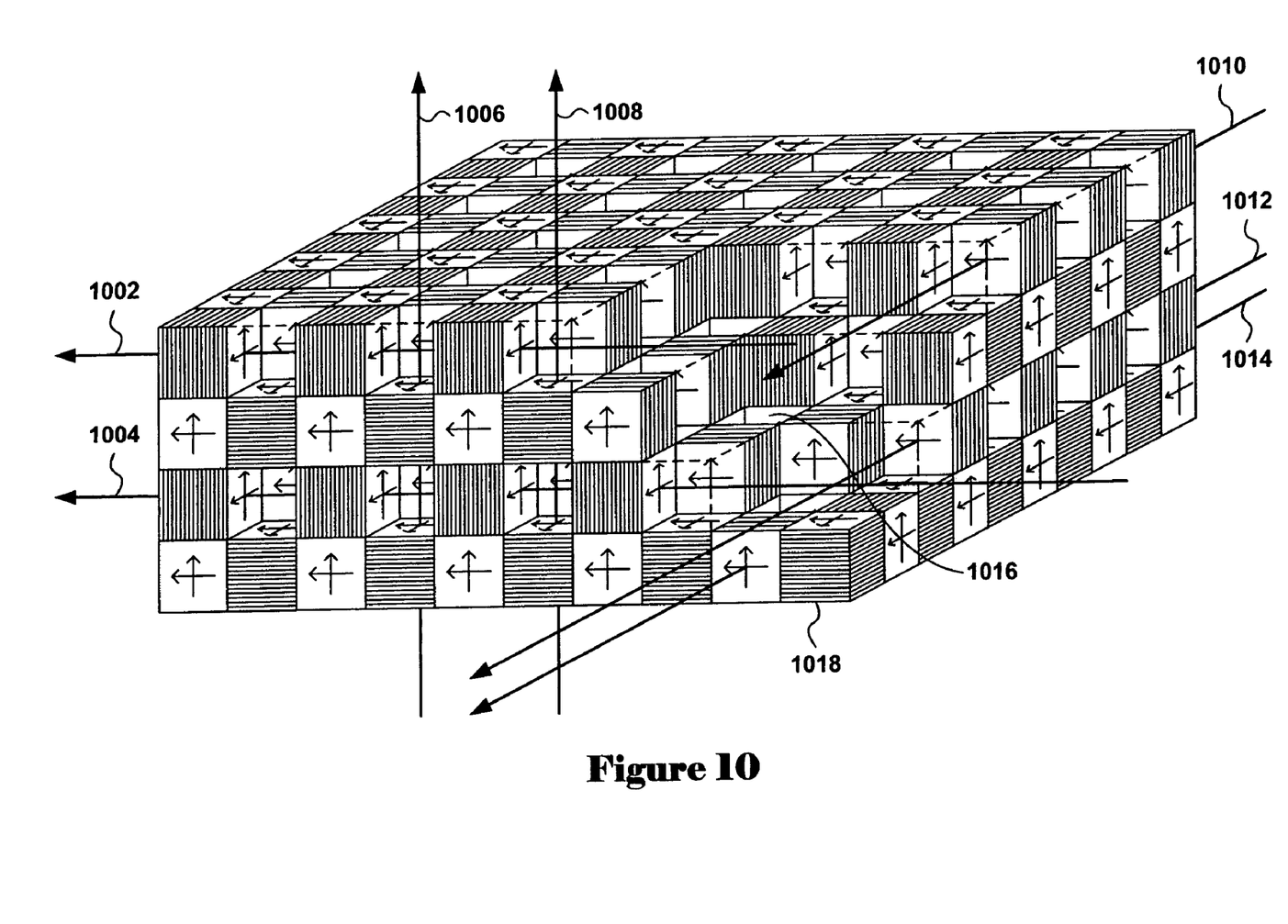
FIG. 10 illustrates a first type of local-flat-component-block column that occurs within a three-dimensional PRU tiling employed in certain methods of the present invention.
Figure 11:
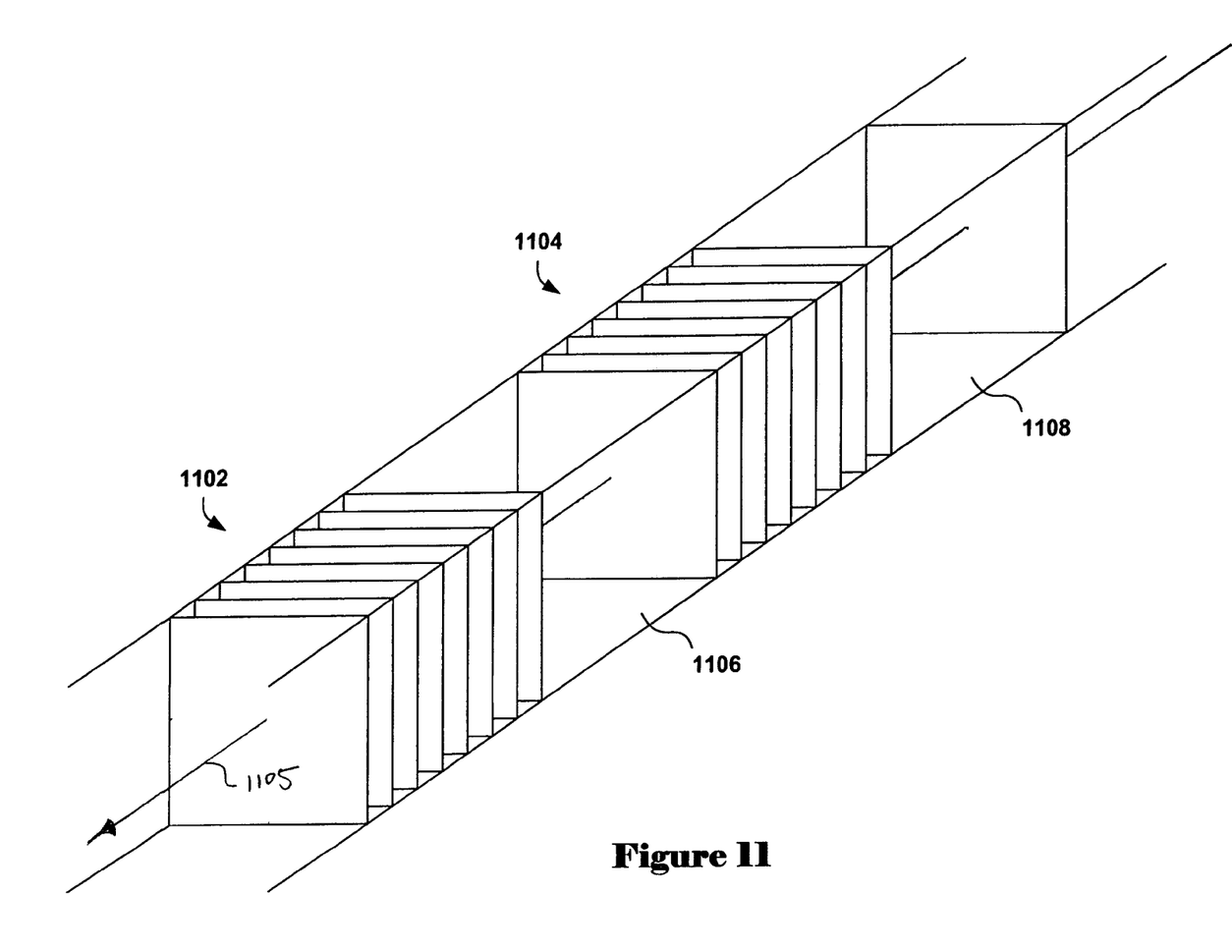
FIG. 11 shows a more detailed view of a portion of a column of the first type.

Although the three-dimensional tiling of a volume by PRUs, as illustrated in FIG. 9, may, at first glance, appear to be rather complex, it contains only two different types of columns. FIG. 10 illustrates a first type of local-flat-component-block columns that occur within the three-dimensional PRU tiling employed in certain methods of the present invention. This first type of column may be found in any of the three, orthogonal dimensions parallel to the edges of the rectangular volume. Arrows passing through the centers of selected columns of the first type are shown in FIG. 10, with arrows 1002 and 1004 illustrating horizontal columns of the first type in a first direction, arrows 1010, 1012, and 1014 illustrating horizontal columns of the first type in a second, orthogonal direction, and arrows 1006 and 1008 illustrating vertical columns of the first type. FIG. 11 shows a more detailed view of a portion of a column of the first type employed in certain methods of the present invention. A column of the first type includes alternating local flat-component blocks 1102 and 1104 with parallel sets of flat components orthogonal to the axis of the column 1105 interspersed with open slots 1106 and 1108. Within the interior of a three-dimensional PRU tiling, each open slot, such as open slot 1106, is fully enclosed by flat components coincident with all six faces of the open slot provided by neighboring local flat-component blocks. For example, referring back to FIG. 10, open slot 1016 has four vertical flat component sides and, although obscured in FIG. 10, a flat component bottom, all contributed by neighboring local flat-component blocks. Open slot 1016 is seen in cutaway, where the local flat-component block directly above open slot 1016 has been removed. That removed local flat-component block would have the same orientation as local flat-component block 1018, and would thus provide the final, sixth enclosing flat component surface. In an implementation using local flat-component blocks of the type shown in FIG. 4, open slots would not be fully enclosed, but would have open spaces along all 8 edges.

Figure 12:
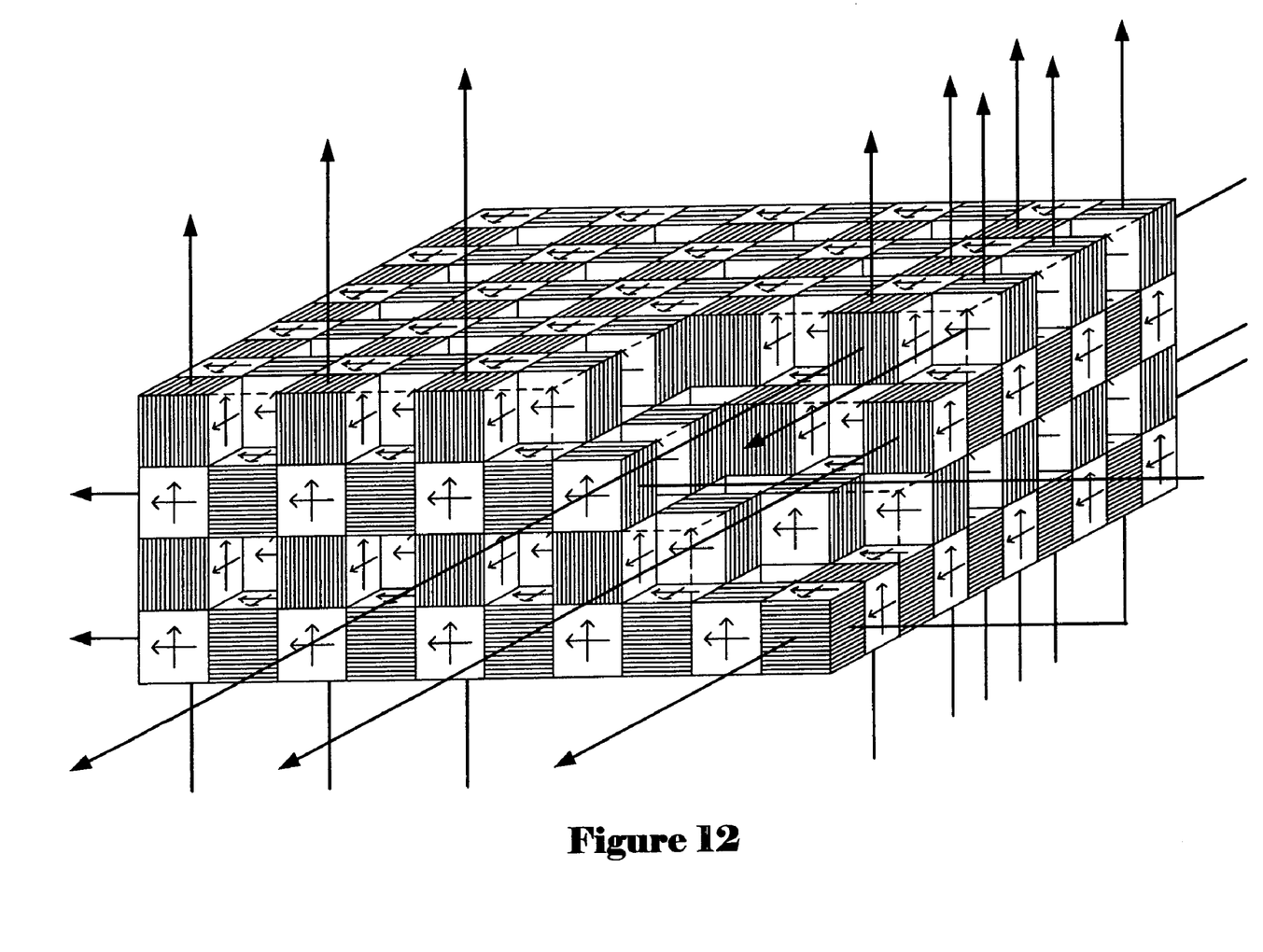
FIG. 12 illustrates a second type of local-flat-component-block column that occurs in all three, mutually perpendicular directions within a three-dimensional rectangular volume tiled with PRUs employed in certain methods of the present invention.
Figure 13:
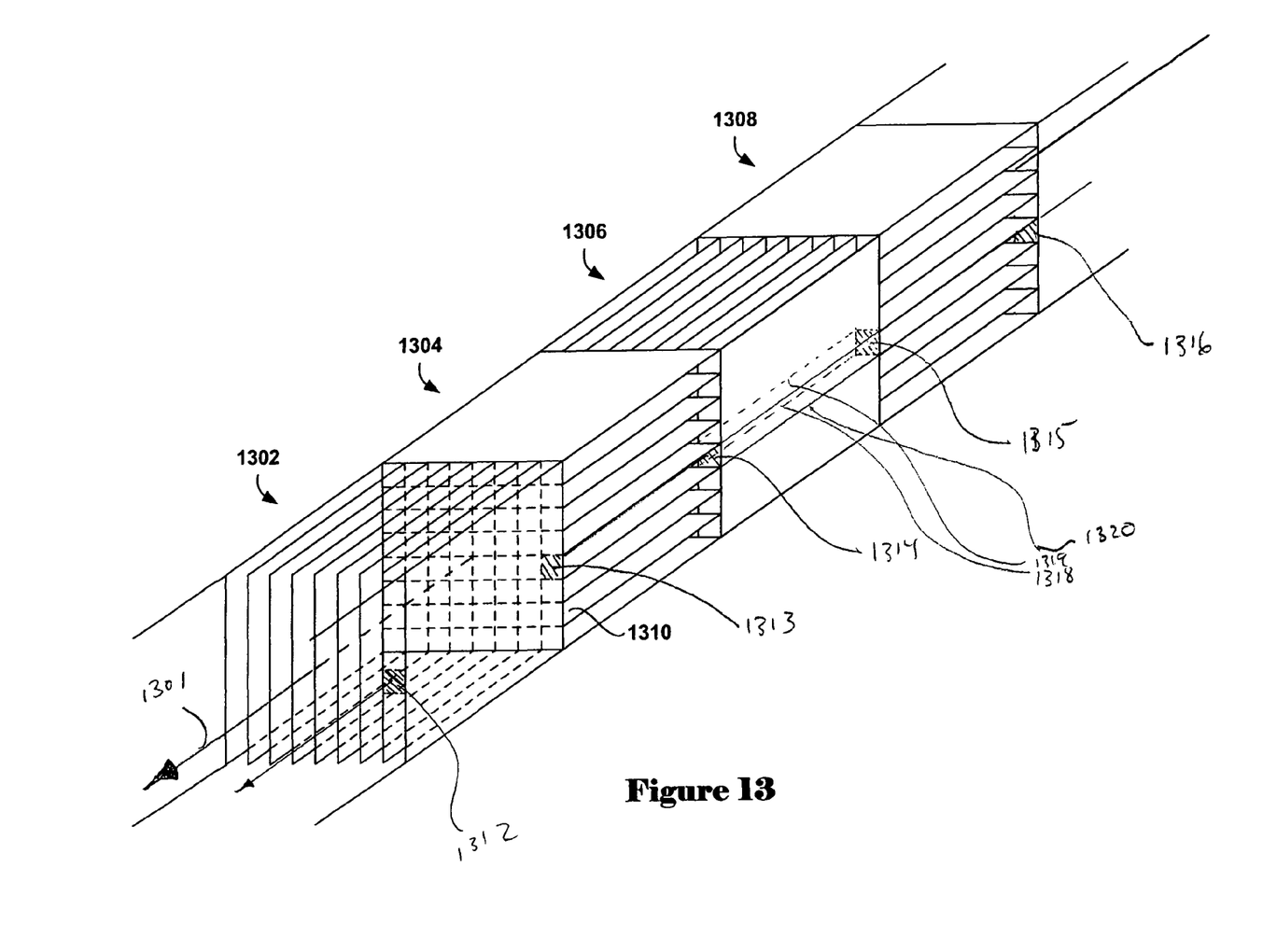
FIG. 13 shows a more detailed view of a portion of a local-flat-component-block column of the second type employed in certain methods of the present invention.

FIG. 12 illustrates a second type of local-flat-component-block column that occurs in all three, mutually perpendicular directions within a three-dimensional rectangular volume tiled with PRUs employed in certain methods of the present invention. FIG. 12 uses the same illustration conventions as FIG. 10, with arrows indicating selected local-flat-component-block columns of the second type. A more detailed view of a portion of a local-flat-component-block of the second type, employed in certain methods of the present invention, is shown in FIG. 13. The second type of local-flat-component-block column includes local flat-component blocks having flat components parallel to the axis of the column 1301. Local flat-component blocks with vertical flat components 1302 and 1306 alternate with the local flat-component blocks having horizontal flat components 1304 and 1308. As a result, a local-flat-component-block column of the second type includes small, rectangular, open columns that traverse the entire length of the local-flat-component-block columns of the second type. These small open, interior columns are seen in cross-section in the interface 1310 between local flat-component blocks 1302 and 1304. Were one to look directly down the axis of a local-flat-component-block of the second type, the flat components of all the local flat-component blocks contained within the column would be viewed on edge, and would form a grid identical to the grid at the interface 1310 between local flat-component blocks 1302 and 1304. The space within each cell of the grid would be visually unimpaired for the entire length of the local-flat-component-block column of the second type. One small, interior column is indicated in FIG. 13 by cross-hatched inter-flat-component-block interfaces 1312-1316, dotted lines 1318-1319, and solid line 1320. Electrical, optical, or fluid communication paths can be located within these interior, open columns in order to traverse all local flat-component blocks in a local-flat-component-block column of the second type between two opposite sides of a three-dimensional re-tiled volume. Each local flat-component block within the three-dimensionally tiled volume is contained within two different local-flat-component-block columns of the second type. Thus, there is a clear, unimpeded, linear path from four different surfaces of a rectangular three-dimensional arrangement of local flat-component blocks to each flat component in the interior of the three-dimensionally tiled volume. Each flat component is therefore directly and easily accessible by whatever means of communication is needed to provide input to, receive output from, and maintain each flat component within a three-dimensional arrangement of flat components. The direct paths are, in addition, relative short, in terms of the number of local flat-component blocks along the path. In general, the largest number of local flat-component blocks that need to be traversed along a linear path to reach an internal local flat-component block is proportional to $$\frac{1}{2}(\sqrt[3]{N})$$

where N is the number of local flat-component blocks within a specified, spherically symmetric volume. Considering a rectangular, specified volume, the largest number of local flat-component blocks that need to be traversed along a linear path to reach an internal local flat-component block does not exceed $$\frac{1}{2}d_2$$

where $d_2$ is the next-to-smallest dimension of the volume in units of local flat-component blocks, or the smallest dimension, when the magnitudes of two equal dimensions are less than a third dimension of greater magnitude. These linear paths allow electrical, optical, fluidic, or other types of signals and materials to flow through the three-dimensional lattice of PRUs.

Although the present invention has been described in terms of a particular embodiment, it is not intended that the invention be limited to this embodiment. Modifications within the spirit of the invention will be apparent to those skilled in the art. For example, as discussed above, the asymmetry of each flat component with respect to male and female connectors results in the columns of the second type within the three-dimensional tiling to have a direction, as indicated by the arrows on two of the faces of the local flat-component blocks. Because the columns have directions, the three-dimensional tiling shown in FIGS. 9, 10, and 12, are chiral in nature, and are related by mirror symmetry to a mirror-image tiling. Thus, the described three-dimensional tiling actually encompasses two equivalent, mirror-image tilings. Repeating, three-dimensional lattices are well known in mathematics and crystallography. Similar, but different lattices composed of different types of PRUs may also be employed to provide three-dimensional flat component tilings that provide for direct, unobstructed communications channels from exterior surfaces of the three-dimensional volume to any flat component within the lattice. As discussed above, the possible symmetries of PRUs reflect the underlying symmetries of flat components, and the symmetries of the PRU in turn determine the type of repeating, three-dimensional lattices that the PRUs may occupy. Within a three-dimensional tiling, small enclosed spaces may be obtained by removing one or more contiguous local flat-component blocks in order to provide space for large components of various types. Thus, the three-dimensional space tiled by PRUs may not be a continuous space, but may instead include channels, invaginations, and enclosed subspaces. As discussed above, the three-dimensional arrangement of flat components may be used for tightly packing any of an almost limitless variety of different types of computer-system and electronics-system components within a defined three-dimensional space.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Obviously many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A system having a number of flat components arranged in a three-dimensional lattice, the three-dimensional lattice comprising:
    local component blocks, each comprising a number of parallel, flat components held together at an inter-component spacing, arranged into a number of primitive repeating units, each primitive repeating unit including four slots, three of the four slots filled with three, mutually perpendicularly oriented local component blocks, and a fourth slot empty, the primitive repeating units in turn arranged into two-dimensional layers that are stacked one upon another to produce the three-dimensional lattice so that each flat component within the three-dimensional lattice can be accessed through a linear, unobstructed space from a point on an external surface of the three-dimensional lattice.

2. The system of claim 1 wherein the flat components include one or more:
    internal optical components;
    internal electrical components;
    internal fluidic components;
    internal mechanical components; and
    internal hybrid, combination components.

3. The system of claim 1 wherein each flat component is approximately square, and includes evenly spaced connectors on each edge.

4. The system of claim 3 wherein each flat component in a selected first local component block is similarly oriented, so that each flat component of a neighboring, second local component block with flat components orthogonal to, but containing a common line with, each flat component of the first local component block may be interconnected to each flat component of the first local component through a pair of connectors, one connector of the pair contributed by flat components of each of the first and second local component blocks.

5. The system of claim 4 wherein each two-dimensional layer comprises identically oriented primitive repeating units attached into a 2-dimensional grid comprising rows and columns of primitive repeating units.

6. The system of claim 5 wherein each two-dimensional layer in the three-dimensional lattice is staggered from neighboring layers by a translation of one half of a primitive-repeating-unit dimension in two orthogonal directions coincident with the grid directions of the two-dimensional layers.

7. The system of claim 1 wherein the linear, unobstructed spaces from a point on an external surface of the three-dimensional lattice, by which each flat component within the three-dimensional lattice can be accessed, provide paths through which electrical, optical, fluidic, or other signals can flow through the three-dimensional lattice.

8. A method for constructing a dense, interconnected three-dimensional lattice of flat components, the method comprising:
arranging flat components into local component blocks, each local component block comprising a number of parallel flat components held together at an inter-component spacing;
arranging the local component blocks into a number of identical primitive repeating units, each primitive repeating unit includes four slots, three of the four slots filled with three, mutually perpendicularly oriented local component blocks, and a fourth slot empty; and
arranging the primitive repeating units into two-dimensional layers, each two-dimensional layer comprises identically oriented primitive repeating units attached into a 2-dimensional grid comprising rows and columns of primitive repeating units, that are stacked, in a staggered fashion, one upon another to produce the three-dimensional lattice so that each flat component within the three-dimensional lattice can be accessed through a linear, unobstructed space from a point on an external surface of the three-dimensional lattice, each two-dimensional layer in the three-dimensional lattice staggered from neighboring layers by a translation of one half of a primitive-repeating-unit dimension in two orthogonal directions coincident with the grid directions of the two-dimensional layers.

9. The method of claim 8 wherein the flat components include one or more:
internal optical components;
internal electrical components;
internal fluidic components;
internal mechanical components; and
internal hybrid, combination components.

10. The method of claim 8 wherein each flat component is approximately square, and includes evenly spaced connectors on each edge.

11. The method of claim 8 wherein the linear, unobstructed spaces from a point on an external surface of the three-dimensional lattice, by which each flat component within the three-dimensional lattice can be accessed, provide paths through which electrical, optical, fluidic, or other signals can flow through the three-dimensional lattice.

* * * * *